United States Patent [19]

Wells et al.

[11] Patent Number: 5,369,616
[45] Date of Patent: Nov. 29, 1994

[54] METHOD FOR ASSURING THAT AN ERASE PROCESS FOR A MEMORY ARRAY HAS BEEN PROPERLY COMPLETED

[75] Inventors: Steven E. Wells, Citrus Heights; Eric J. Magnusson, Orangevale, both of Calif.

[73] Assignee: Intel Corporation, Santa Clara, Calif.

[21] Appl. No.: 207,228

[22] Filed: Mar. 7, 1994

Related U.S. Application Data

[63] Continuation of Ser. No. 969,032, Oct. 30, 1992, abandoned.

[51] Int. Cl.$^5$ .................................................. G06F 13/16
[52] U.S. Cl. .................................. 365/218; 365/201; 365/900; 371/21.6
[58] Field of Search .................. 365/218, 900, 201; 371/21.6

[56] References Cited

U.S. PATENT DOCUMENTS

| | | | |
|---|---|---|---|
| 4,642,759 | 2/1987 | Foster | 364/200 |
| 4,644,494 | 2/1987 | Muller | 364/900 |
| 4,763,305 | 8/1988 | Kuo | 365/201 |
| 4,802,117 | 1/1989 | Chrosny et al. | 364/900 |
| 4,896,262 | 1/1990 | Wayama et al. | 364/200 |
| 4,958,315 | 9/1990 | Balch | 364/900 |
| 5,012,425 | 4/1991 | Brown | 364/464.02 |
| 5,101,490 | 3/1992 | Getson, Jr. et al. | 395/425 |
| 5,111,385 | 5/1992 | Hattori | 395/425 |
| 5,131,089 | 7/1992 | Cole | 395/500 |
| 5,199,033 | 3/1993 | McGeoch et al. | 371/10.1 |
| 5,200,959 | 4/1993 | Gross et al. | 371/21.6 |
| 5,224,070 | 6/1993 | Fandrich et al. | 365/185 |

FOREIGN PATENT DOCUMENTS

| | | | |
|---|---|---|---|
| 2088442 | 7/1993 | Canada | 13/16 |
| 0175458A2 | 3/1986 | European Pat. Off. | |
| 0392895 | 10/1990 | European Pat. Off. | 16/6 |
| 2665791 | 2/1992 | France | 365/218 |
| 2251323 | 1/1992 | United Kingdom | 12/2 |
| 2251324 | 1/1992 | United Kingdom | 12/2 |

OTHER PUBLICATIONS

Solid-State Mass Storage Arrives, Product Feature, Memory Card Systems & Design, Jul./Aug. 1992.

*Primary Examiner*—Viet Q. Nguyen
*Attorney, Agent, or Firm*—Blakely, Sokoloff, Taylor & Zafman

[57] ABSTRACT

A method for insuring that an erase operation practiced on a block of flash EEPROM transistors is carried out reliably including the steps of: writing whenever the erasure of a block of the flash EEPROM array is to commence to a position in the array to indicate that an erasure of the block has commenced, writing whenever the erasure of a block of the flash EEPROM array is complete to the position in the array to indicate that an erasure of the block has been completed, testing to determine any positions in the array which indicate that an erasure of a block has commenced but not been completed upon applying power to the flash EEPROM array, and reinitiating an erase if any positions in the array exist which indicate that an erasure of a block has commenced but not been completed.

4 Claims, 5 Drawing Sheets

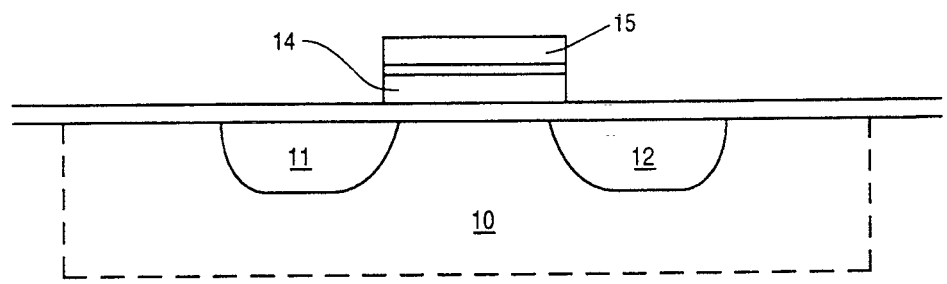
FIG_1
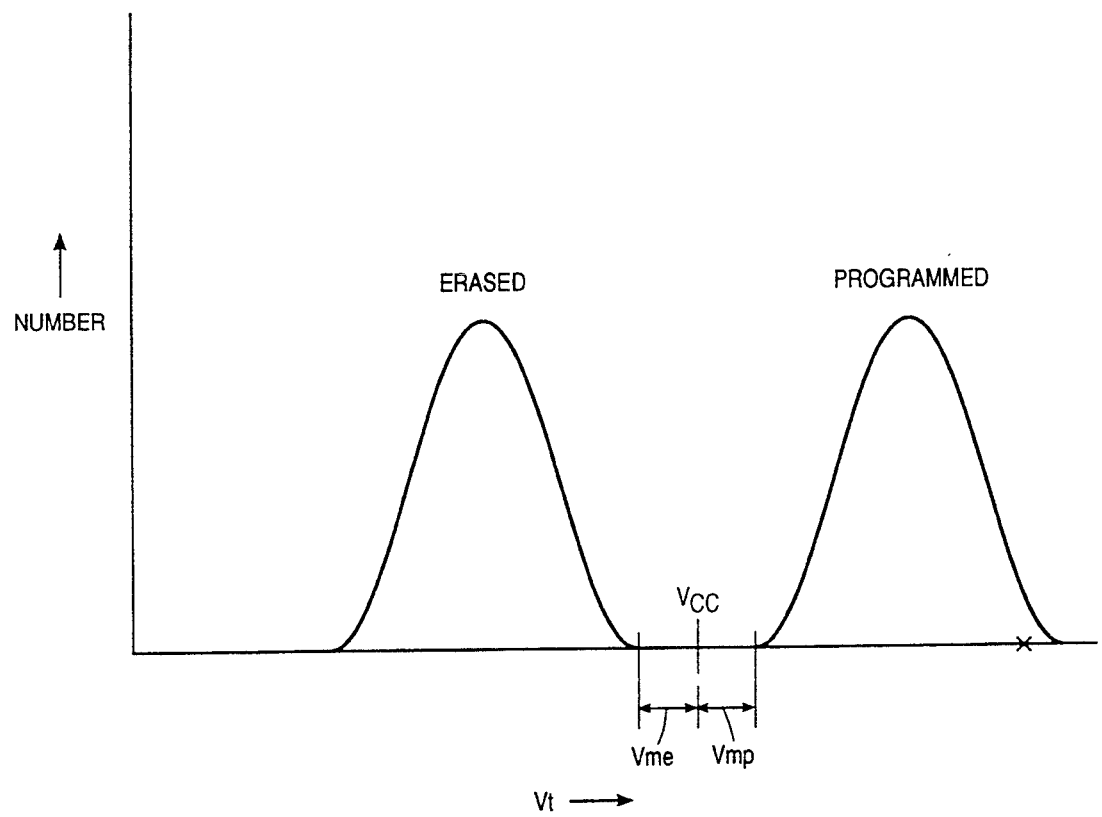
FIG_2

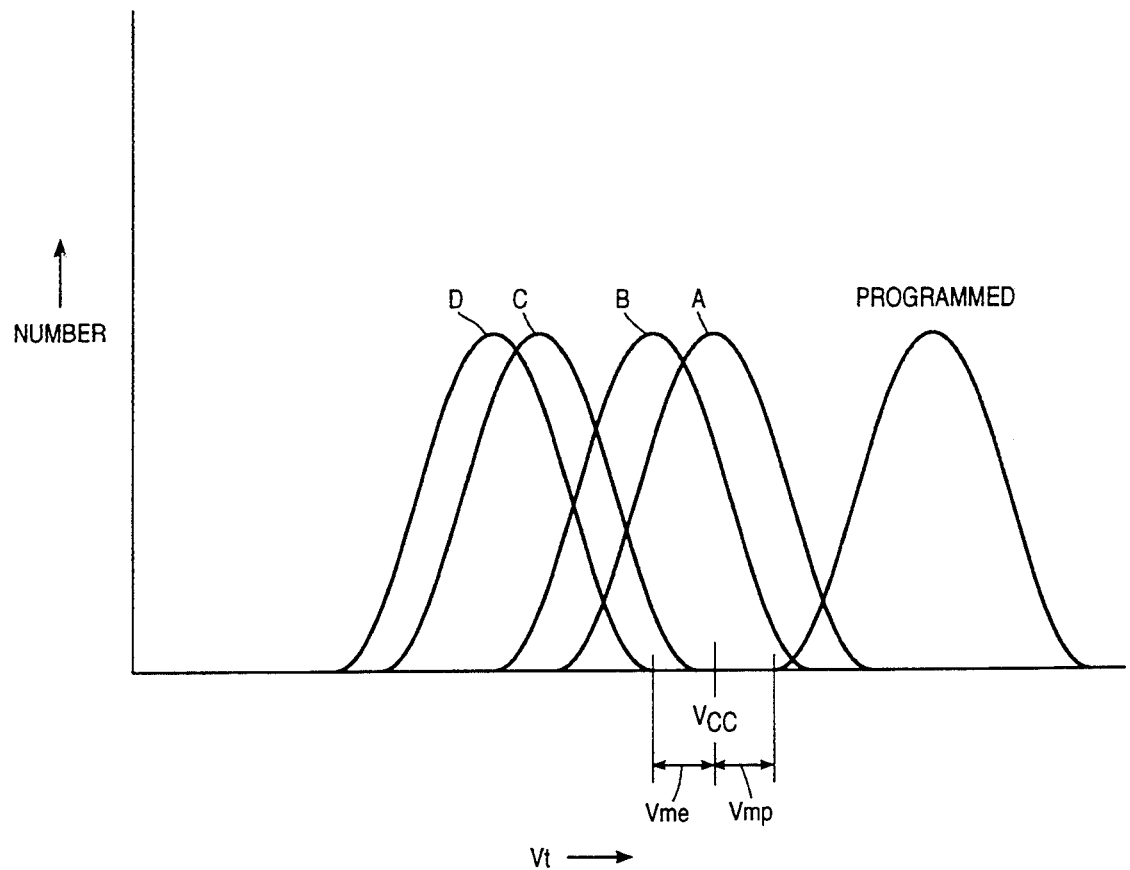

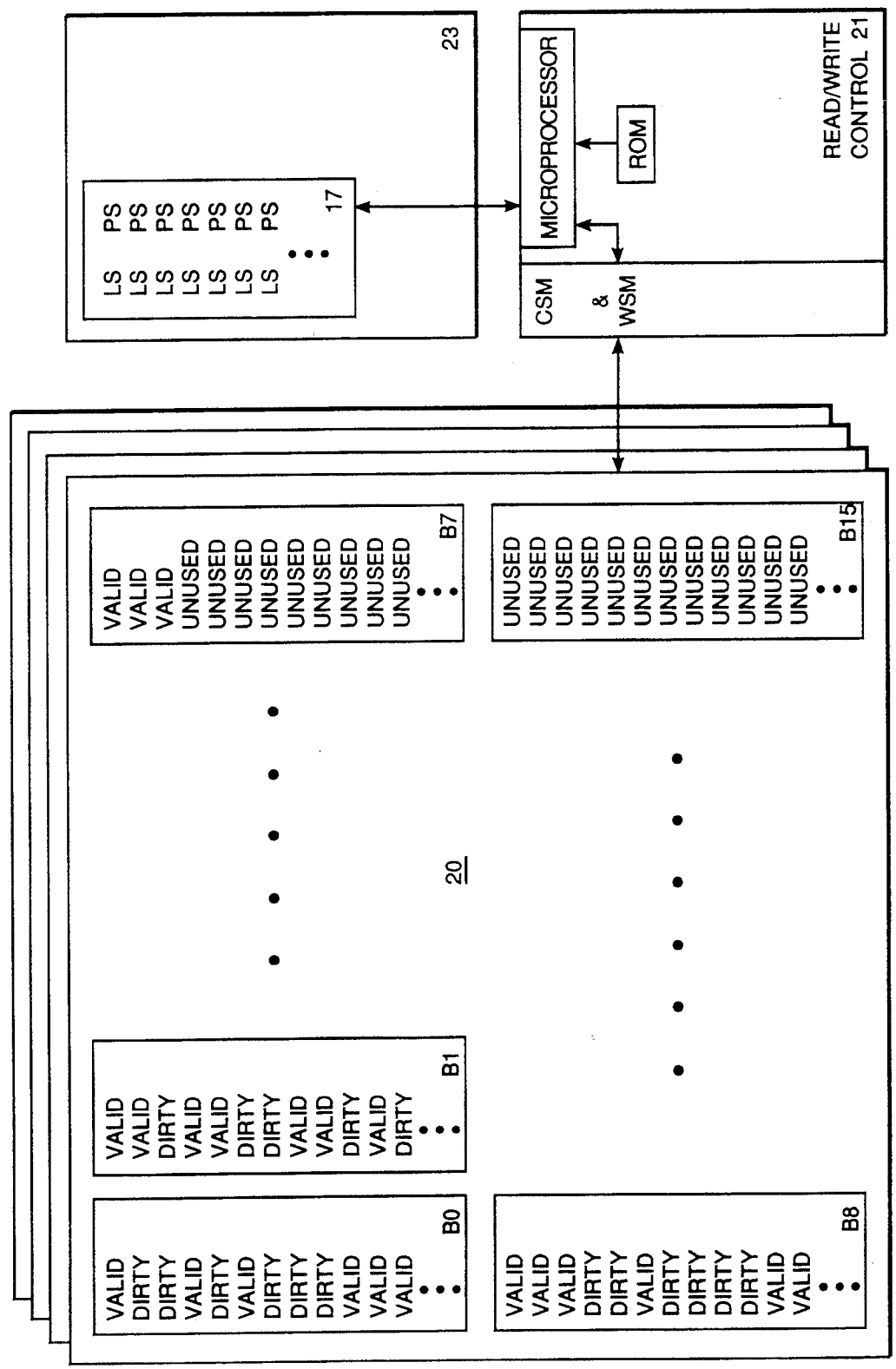
FIG_4

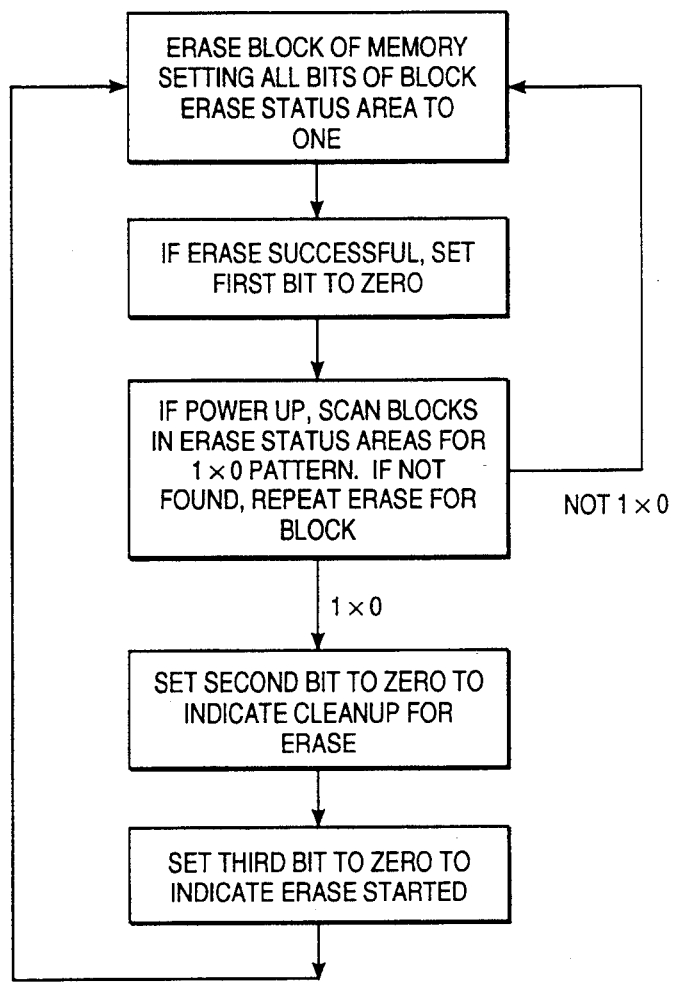
FIG_7
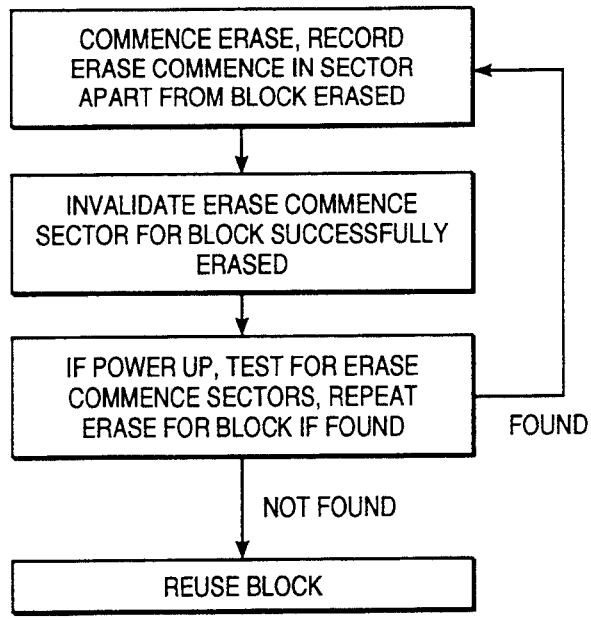
FIG_8

METHOD FOR ASSURING THAT AN ERASE PROCESS FOR A MEMORY ARRAY HAS BEEN PROPERLY COMPLETED

This is a continuation of application Ser. No. 07/969,032, filed Oct. 30, 1992, abandoned.

BACKGROUND OF THE INVENTION

1. Field of the Invention

This invention relates to memory arrays and, more particularly, to methods for assuring that an erase operation has taken place in a flash electrically erasable programmable read only memory (flash EEPROM) array.

2. History of the Prior Art

Modern computer systems make extensive use of long term memory. Typically this memory is provided by one or more hard (fixed) disk drives. A hard disk drive is an electro-mechanical device which includes one or more flat circular disks fixed to rotate rapidly about a central axis. Each flat disk has opposite surfaces which are coated with some form of magnetic material upon which bits of data may be stored by a magnetic head carried by a mechanical arm. The bits are stored in fixed size sectors of a plurality of tracks which lie on each side of a magnetic disk. A typical disk drive used in personal computers today is capable of storing forty or more megabytes of data.

Such disk drives are very useful and have become almost a necessity to the operation of personal computers. However, such electro-mechanical drives do have their drawbacks. They are relatively heavy and increase the weight of a computer, especially a portable computer, significantly. More importantly, electro-mechanical hard disk drives are very susceptible to shock. A hard disk drive in a portable computer which is dropped is quite likely to cease functioning with a catastrophic loss of data.

Recently, forms of long term storage other than electro-mechanical hard disk drives have become feasible for use in computers. One of these forms of long term storage is called flash EEPROM. Flash EEPROM memory is comprised of a large plurality of floating gate transistors arranged as memory cells in typical row and column fashion with circuitry for accessing individual cells and placing the memory transistors of those cells in one of two memory conditions. In contrast to the transistors used in dynamic random access memory, a flash memory cell (like other EPROM cells) retains information when power is removed. Flash EEPROM memory has a number of characteristics which adapt it to use as long term memory. It is light in weight and occupies very little space. More importantly, it is especially rugged. It will withstand without adverse effects repeated drops each of which would destroy a typical electromechanical hard disk.

A peculiarity of flash EEPROM, however, is that one form is erased by applying a high voltage simultaneously to the source terminals of all of the transistors (cells) used in a large portion of the array. Because these source terminals are all connected to one another in the array by metallic busing, the entire portion of the array must be erased at once. While an electro-mechanical hard disk will typically store information in a first area of the disk and then rewrite that same area of the disk when the information changes, this is not possible with a flash memory array without erasing all of the valid information that remains in that portion of the array along with the invalid (dirty) information.

Because of this, a different arrangement is used for rewriting data and erasing dirty sectors of a flash EEPROM array. First, the entire array is divided into smaller separately erasable blocks so that when a block is erased the amount of valid data which must be reprogrammed is reduced. Typically, the array is composed of a number of silicon chips; and each such chip includes a number of such blocks. Then, when the information at a data entry changes, the changed information is written to a new sector on an available block rather than written over the old data; and the old data is marked dirty. After a sufficient number of sectors on a block have been marked dirty, the entire block is erased. When erasure occurs, all of the valid data in the block to be erased is written to a new block; and then the dirty block is erased and put back into use as a clean block of memory. Because of this involved erasure process, it typically takes as much as two seconds to erase a block of a flash EEPROM array. However, because erasure need not occur with each entry which is rewritten, erasure may be delayed until a block contains a sufficient amount of dirty information that cleanup is feasible. This reduces the number of erasure operations to a minimum and allows erasure to occur in the background when the facilities for controlling the array are not otherwise occupied with reading and writing.

A problem which occurs with this and other forms of flash EEPROM, however, is that the background erasing process may be occurring at an instant at which power is removed from the system. This might occur with a power outage but is as likely to occur whenever the system is simply turned off since the process of erasure occurs in the background so far as the computer operating system is concerned. If a block of an array of flash EEPROM cells is in the process of erasure (in one embodiment, the memory cells are being switched from all cells being in the zero state to all cells being in the one state) when power is removed from the system, the cells of that block may or may not be placed into an erased state. Since it is impossible to program cells which are not in the one state, an ineffective erase operation leaves a block temporarily unusable. Consequently, when the power is turned back on, it is desirable for the system to be able to determine the condition of any blocks of the array which were being erased when power was removed so that the erase process may be repeated and those blocks may be properly utilized by the system.

SUMMARY OF THE INVENTION

It is, therefore, an object of the present invention to provide a method for determining the reliability of an erase operation in a flash EEPROM array.

It is another object of the present invention to provide a method by which blocks of a flash EEPROM array which were in the process of being erased when power was removed may be tested to determine whether an effective erase occurred.

These and other objects of the present invention are realized in a method for insuring that an erase operation practiced on a block of flash EEPROM transistors is carried out reliably including the steps of writing whenever the erasure of a block of the flash EEPROM array is to commence to a position in the array to indicate that an erasure of the block has commenced, writing whenever the erasure of a block of the flash EEPROM array is complete to the position in the array to indicate that an erasure of the block has been completed, testing to determine any positions in the array which indicate that an erasure of a block has commenced but not been completed upon applying power to the flash EEPROM array, and reinitiating an erase if any positions in the array exist which indicate that an erasure of a block has commenced but not been completed.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is an illustration of a single memory transistor used in a flash EEPROM array.

FIG. 2 is a diagram illustrating the distribution of transistors in two different conditions.

FIG. 3 illustrates a number of possible distributions of memory cells after an erase operation.

FIG. 4 is a block diagram illustrating a portion of a flash EEPROM array.

FIG. 6 is a diagram illustrating a series of bits stored in an erase status area in accordance with the invention.

FIG. 7 illustrates the steps of a method for assuring the reliability of an erasure operation in accordance with the invention.

FIG. 8 illustrates the steps of a second method for assuring the reliability of an erasure operation in accordance with the invention.

NOTATION AND NOMENCLATURE

Figure 5:
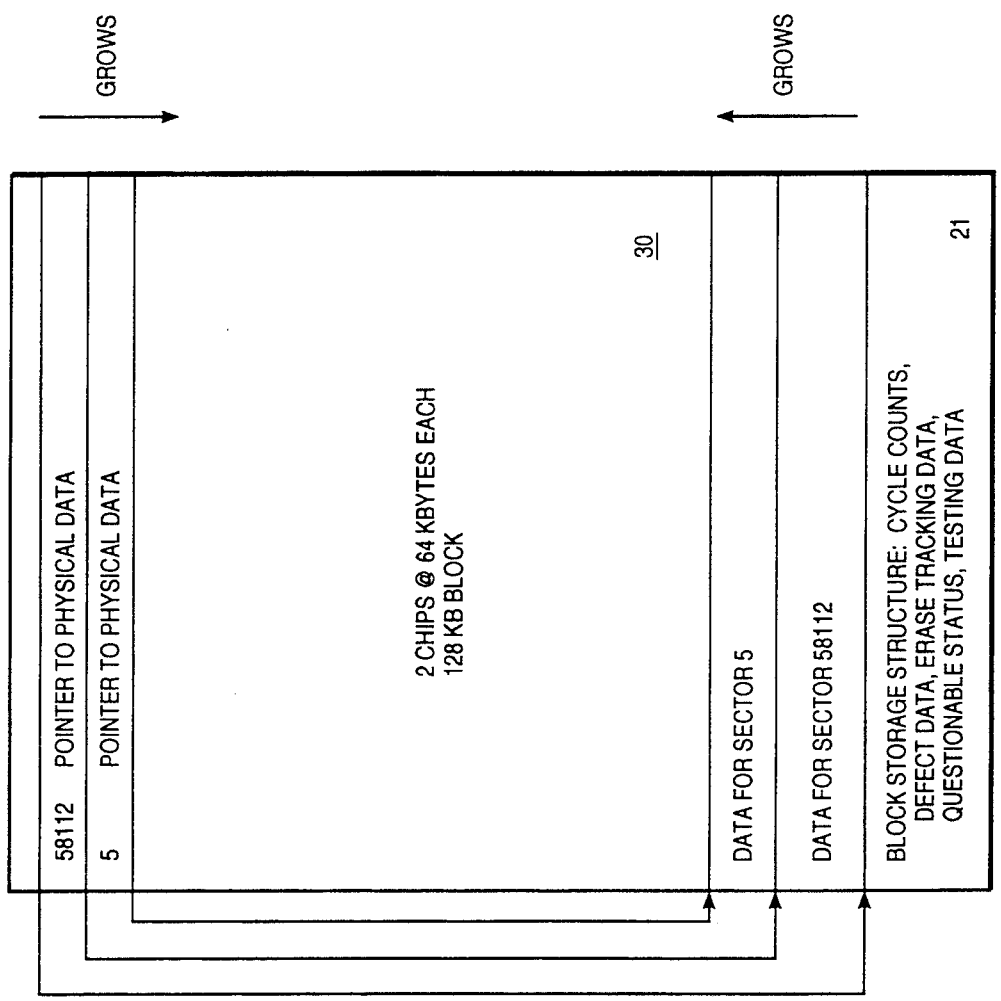
FIG. 5 illustrates the arrangement of data in a single block of a flash memory array.

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to a method for operating a computer in processing electrical or other (e.g. mechanical, chemical) physical signals to generate other desired physical signals.

DETAILED DESCRIPTION

As outlined above, a difficulty with flash EEPROM arises from the fact that it is not reprogrammable until it has been erased. Using the typical operating voltages available, the transistors of a flash EEPROM array can only be switched from a one to a zero condition. The condition can be reversed to one only by applying a voltage higher than typical operating voltages (usually twelve volts) to the source terminals of the memory transistors. Flash EEPROM in which data has been stored is erased by first programming all of the cells which are in a one condition to a zero condition and then applying a high voltage to the source terminals of all of the transistors in the array to place all in the one condition. Because these source terminals are all connected together by metallic busing in the array, the entire array must be erased at once. While an electro-mechanical hard disk drive will typically store information in a first area of the disk and then rewrite that same area of the disk when the information changes, this is not possible with flash EEPROM memory without erasing all of the valid information that remains in the array along with the invalid (dirty) information. This requires that the entire array be reprogrammed with the valid information once it has been erased. As may be appreciated, such a process, if used as each entry changed, would significantly slow the operation of any computer system using flash memory in place of an electro-mechanical hard disk drive. Moreover, because the erase process is so complicated, it is quite slow; it typically requires between one and two seconds. Such an erase time would seem to preclude the use of flash EEPROM as volatile memory.

However, a new method of erasing and rewriting the flash array has been devised which differs from that typically used for electro-mechanical hard disk drives and which allows flash EEPROM to be used for long term storage where data is rapidly changing. A new arrangement is disclosed in U.S. patent application Ser. No. 07/969,131, entitled *Method and Circuitry for a Solid State Memory Disk*, S. Wells, filed on even date herewith, and assigned to the assignee of the present invention. In that arrangement, a typical long term storage array is comprised of flash memory arranged in a series of blocks which are separately erasable. This reduces the amount of reprogramming necessary each time an erase occurs. In one embodiment, the array is divided into a number of silicon chips each of which is subdivided into sixteen subblocks. Each subblock is, in fact, physically paired with a subblock on another of the silicon chips to create a logical block of the array in which odd bytes of data are stored on the subblock of one chip and even bytes of data are stored on the subblock of the other chip. Each of the logical blocks of flash memory is separately erasable from all other such blocks. However, even with this division of data into individually-erasable blocks, erasure of a block effects erasure of such a very large amount of information that to attempt to erase all of the data and then replace the valid data with each rewrite of a sector would be impossible.

In order to overcome this problem, data is written to any block of the flash memory array which has space available. Thus data is written to an empty position in the array no matter what the apparent address of the data or the address on the block. A piece of data to be written to a sector five, for example, is written to the next available sector of a block being written no matter where that may be; and a lookup table which records the physical position on the block together with the logical address (sector five) is kept apart from the flash memory array. This arrangement of the array allows a first block to be written sector by sector, a second block to be written in the same sequential manner, and so on. When a sector is rewritten, the data is written to a new physical position, the data in the lookup table is changed to record the new physical position against the logical sector number, and the first position at which the data was written is marked as dirty. After some period of time, a sufficient number of blocks will have been filled that it will be desirable to release space by moving the valid information from some especially dirty block to some other block and erasing the entire block from which the valid information has been moved. This has the effect of freeing an additional number of sectors equal to all of the sectors on the erased block which have previously been marked as dirty.

An especial advantage of the arrangement is that since erasure of invalid sectors need not occur each time the sector is rewritten, the erasure of blocks may be delayed to occur in the background and relatively infrequently when contrasted to the amount of information change occurring in the array. Thus, erasure may be adjusted to occur when the facilities of the array are not otherwise occupied with reading and writing. In this manner, the external host which is writing to and receiving information from the flash array is typically not aware that an erasure is taking place even though the erasure requires one or two seconds.

A problem which may occur, however, is that the background erasing process may be happening at an instant at which power is removed from the system. This might take place when a power outage occurs but is as likely to happen whenever the system is simply turned off or when a removable storage disk is removed from system since the process of erasure occurs in the background so far as the computer operating system is concerned. If a block of an array of flash EEPROM cells is in the process of erasure (in one embodiment, the memory cells are being switched from all cells being in the zero state to all cells being in the one state) when power is removed from the system, the cells of that block may or may not be placed into an erased state. Since it is impossible to program cells which are not in the one state, an ineffective erase operation leaves a block temporarily unusable. Consequently, when the power is turned back on, it is desirable for the system to be able to determine the condition of any blocks of the array which were being erased when power was removed so that the erase process may be repeated and those blocks may be properly utilized by the system.

FIG. 1 should lead to a better understanding of the problem. FIG. 1 illustrates a single memory transistor 10 of the type used in a flash memory array in partially completed form. As may be seen, the transistor 10 is a floating gate MOS field effect transistor having a drain region 11, a source region 12, a floating gate 14, and a control gate 15. The source region 12 and the drain region 11 are embedded in the silicon substrate material which separates the two areas and are typically doped with an arsenic dopant, and the source region may be additionally doped with a phosphorous dopant. The polysilicon floating gate 14 is generally disposed between the drain and source regions and insulated from them by a layer of silicon dioxide. The control gate 15 is insulated from the floating gate 14, typically, by a layer of silicon dioxide. The N channel device may be fabricated directly in a P type substrate or formed in some other well known manner. Conductors are connected to each of the drain 11, source 12, and control gate 15 for applying signals to affect the flow of electrons and holes between the various parts of the transistor 10. In one embodiment, the control gate 15 is fabricated on a second layer of polysilicon and is part of a continuous strip of polysilicon forming a wordline in the array of which the transistor is a part. The transistor may be constructed using well-known CMOS technology.

Floating gate transistors are programmed by negatively charging the floating gate 14 by coupling the word line connected to the control gate 15 to a potential of approximately +12 volts, the drain region to approximately +7 volts, and the source region to ground. With these conditions, channel hot electron injection occurs through the oxide layer 14. To erase the cell, the drain region is floated, the word line connected to the control gate 15 is grounded, and a potential of approximately +12 volts is applied to the source region. Under these conditions, charge is tunneled from the floating gate. A cell is read by applying a positive potential (less than that which would cause charge to transfer onto the floating gate) to the control gate 15, applying ground to the source region, and applying a potential of 1 volt to the drain region. Current through the device is sensed to determine if the floating gate is or is not negatively charged. If there is charge on the floating gate, then no drain current flows when a cell is read. Thus, a programmed cell produces a zero output value when interrogated. In contrast, if the transistor has not been programmed and no charge exists on the floating gate, then drain current flows when the cell is read. Thus, a transistor 10 which has not been programmed provides an output of one when interrogated.

It is, therefore, typical that a block of an array of flash EEPROM memory cells are all erased, that is, placed in the condition in which no charge is stored on the floating gate and in which interrogation will produce a one value prior to data being stored in the array. This is accomplished by providing a high voltage Vpp (typically twelve volts) to the source terminals of all of the memory transistors at once while holding the gate terminals at ground and floating the drain terminals. Then once the cells have been erased, as data is stored in the memory cells of the block, those cells which are to store a one condition remain in the condition in which they were placed by erasure while those cells which are to store a zero condition are switched to the programmed condition.

When a sufficient amount of a block of the array contains invalid information that it is time to again erase the array, this is accomplished in a two step process. First, all of the cells in the one condition are programmed to the zero condition; and then the entire block is erased by applying the high voltage at the source terminals of all of the cells.

From the above discussion, it will be seen that the ability of a memory transistor to provide a value of one or zero depends upon whether charge is stored or is not stored on the floating gate. As would be expected, the amount of charge stored by each of the memory cells of a flash memory array is not identical to that stored by all other memory cells but varies in a typical distribution pattern. FIG. 2 illustrates such a distribution pattern for a first set of memory cells (shown to the left in the figure) which are in the erased state and a second set of cells (shown to the right in the figure) which are in the programmed state. The vertical axis illustrates the relative number of cells in each condition while the horizontal axis is a measure of the gate-source voltage which must be applied to cause each cell to conduct, the Vt of the cell. In an array in which all of the memory transistors are functioning correctly and within tolerances, the voltage Vcc (which is the gate-source voltage applied to interrogate the cells) is greater than the voltage Vt of each of the erased cells and less than the voltage Vt of each of the programmed cells. Thus, when the voltage Vcc is applied to interrogate an erased cell, the cell will provide a one value. Alternatively, when the voltage Vcc is applied to interrogate a programmed cell, the cell will provide a zero value.

Not only do each of the erased cells have a Vt value less than the interformation voltage, but a sufficient margin is also provided in a properly operating array that variations in transistor characteristics over a lifetime, charge loss, variations in temperature, variations in Vcc, and other variations in operating conditions do not affect the ability of the cells to switch conditions, to provide output values when interrogated, or to retain a condition indefinitely. Thus, it is important that sufficient margins be provided between the interrogation voltages (Vcc) applied and the threshold voltages Vt for both the erased transistors and the programmed transistors. Such margins are illustrated in FIG. 2 as Vme and Vmp.

As explained above, when an array (or an individually erasable block of an array) which contains invalid data is to be erased, first, all of the cells in the one state are preconditioned by programming them to the zero state; and then the entire array is erased by applying the high voltage at the source terminals of all of the cells (which are now in the programmed state). Thus, those cells in FIG. 2 lying in the group to the left are first programmed so that they are moved to the distribution group at the right; and then all of the cells are erased so that they are moved to the distribution group at the left.

When the cells are erased, the large voltage Vpp is applied to the source terminals of all of the memory transistors. If everything goes well, all of the erased transistors have threshold voltages Vt which lie at least the margin Vme below the interrogation voltage Vcc. However, if power is lost during the operation, the charge on the floating gates of some of the transistors may not have been completely removed; and the threshold voltages Vt of the apparently erased transistors may lie in a distribution pattern anywhere along the horizontal axis. Some of the transistors may have been erased, some may have been erased but have insufficient margin for reliable operation, others may not have been erased at all. In any case, it is necessary to determine whether the transistors were erased or not. If they were not erased, then the erasure must be repeated so that the array may be used. FIG. 3 illustrates a number of possible distribution patterns for memory cells after an erasure during which power failed. In the distribution pattern labelled "a," a large proportion of the transistors were not erased at all. In the distribution pattern labelled "b," most of the transistors were erased; but there is insufficient margin for at least half of the transistors to provide for temperature, voltage, and other variations. In the distribution pattern labelled "c," all of the transistors were erased; but there is insufficient margin for a small number of transistors to provide for temperature, voltage, and other variations. However, were the transistors in this block tested using prior art methods to determine whether they had been successfully erased, the indication would be that a successful erasure had occurred; however, this is not an indication that the transistors are reliable. In distribution d, all of the transistors were erased; and will function correctly and reliably. As can be seen from the different patterns, it is desirable to have a reliable method to test for a correct erasure In the new arrangement described in the U.S. patent application entitled *Method and Circuitry for a Solid State Disk,* a typical long term storage array is comprised of flash memory divided into a series of individually erasable blocks. FIG. 4 illustrates a group of sixteen such blocks B0-B15 positioned on a single silicon chip 20; the blocks B0-B15 may be considered logical blocks for the purpose of this explanation made up of two physical subblocks residing on different silicon substrates. Also shown are a flash memory controller 21 and a separate memory array 23 apart from the flash memory array 20 for storing information used in the control of the writing to, reading from, and erasure of the flash memory array. Each of the logical blocks B0-B15 of flash memory is separately erasable from all other such blocks. However, each of the logical blocks of the array typically holds 128 kilobytes of data, sufficient to hold 256 sectors of information normally stored on the tracks of an electro-mechanical hard disk drive. Thus, a thirty chip flash array with sixteen individually-erasable subblocks per chip holds about the same amount of data as does a thirty megabyte hard disk. Even with this division of data into 240 individually-erasable blocks, erasure of a block effects erasure of a very large amount of information. Consequently, no attempt is made to erase all of the data and then replace the valid data with each rewrite of a sector.

Instead, data is written to any logical block of the flash memory array which has space available no matter what the apparent address of the data or the address on the block. A piece of data to be written to a particular sector is written to the next available sector of a block being written no matter where that may be; and a lookup table 17 is kept in the array 23 which records the physical position on the block with the logical address. This arrangement of the array allows a first block B0 to be written sector by sector, a second block B1 to be written in the same sequential manner, and so on. When the data in a sector changes so that the sector needs to be rewritten, the data is written to a new physical position, the data in the lookup table 17 is changed to record the new physical position against the logical sector number, and the first position at which the data was written is marked as invalid (dirty) so that an attempt to read that physical position produces an error signal.

After some period of time, a sufficient number of blocks will be filled that it will be desirable to release space by moving the valid information from some especially dirty block to some other block and then erasing the entire block from which the valid information has been read. This releases for use a number of sectors equal to the numbers of dirty sectors on the erased block.

FIG. 5 is an idealized drawing useful in understanding the way data is stored on each block of the array 20. FIG. 5 illustrates a typical block 30 as a rectangle. The rectangular area includes a plurality of transistor devices arranged to provide the 128K bytes of storage which each block provides. As mentioned previously, the area of an individual block is actually split between subblocks on two physical chips, one of which holds odd numbered bytes of data and one of which holds even numbered bytes of data. The individual transistors and the various column and row select lines and other conductors for operating the block are not illustrated but are well known to those skilled in the art of designing flash memory.

As may be seen in FIG. 5, data is stored in the block 30 beginning at the top of the block almost to the bottom. At the top of the block 30 are stored in identification fields or headers the logical sector numbers used by the operating system as addresses for the data. For example, a first sector number 58112 is stored in the first header at the top. With the sector number is stored a pointer value; other information such as an indication of validity may also be stored in each header. The pointer value is an offset from the beginning position on the block 30 and points to a physical address; on the block 30 at which the data for logical sector 58112 is stored. An arrow in FIG. 5 illustrates this physical position at which the first bits of data for the logical sector are stored. In the case of logical sector 58112 which is the first sector on the block 30, the data is written from the address at the address stored with the sector number 58112 to a point at the beginning of the lower data area which is marked by a beginning pointer value illustrated by an arrow extending from the upper left hand corner of the block 30.

FIG. 5 shows a second logical sector 5 and its pointer directed to a physical position on the block 30 which stores the first bit of the data for sector 5. The data for sector 5 is stored in an area which begins just above the most recent data sector written (sector 58112) and extends downward so that the last row of the new data sector lies in the row just above the first row of sector 58112.

The data stored in any sector of the block 20 may be retrieved by going to the position on the block 20 where the sector number is stored and retrieving the pointer to the beginning position of the data and the pointer to the beginning position of the sector whose number is stored immediately above the sector number being retrieved. As was pointed out above, the physical position of the sector number is stored in a lookup table 17 (which is preferably held in static random access memory 23 on the circuit board which holds the other components of the array 20) with the chip number, the block, and other information (such as row and column addresses) for retrieving the data. It should be noted that below the lower data position on each block 30 is an area reserved for block status information. This area is utilized in carrying out the present invention.

The unusual arrangement for rewriting data used by a flash memory array requires that the memory allocation system continually make new memory available for data to be written and rewritten. This requires that some number of blocks always be available in order to allow blocks holding invalid data to be cleaned up and their dirty sectors released.

FIG. 6 illustrates a reliable mechanism for determining whether the transistors of a block of flash memory have been erased so that they will function dependably. FIG. 6 illustrates a series of different conditions of three bits of a block erase status area which is stored in a permanent position on each block (or each subblock if subblocks on more than one chip form a logical block) of a flash memory array, preferably in the block status area below the bottommost entry to which data is written. In one embodiment of the array, this area of memory transistors in which the block erase status region is positioned is utilized to store various information related to control of the blocks of the memory. For example, information regarding blocks which may no longer be operative and the number of erase operations to which the block has been subjected may be stored in this area.

In FIG. 7 are illustrated the steps of the method which causes the conditions of the three bits used to record the erase status to vary as well as the steps of a process for checking the reliability of the erasure operation. Typically, although not necessarily, the process is implemented in software carried out by a microprocessor which is a part of the controller 21. The process may be stored in read only memory which is also a part of the controller 21.

When a block of flash memory is erased, the three bits of the block erase status area for that block of memory which are stored in memory transistors on the block are erased with the rest of the memory transistors on the block and are, consequently, set to one values. A command state machine which may be logically considered to be is a part of the flash memory controller 21 sends a signal to indicate when it has completed the erase operation successfully. The command state machine acts as an interface for read, write and erase operations to the chips of the array. Although discussed as a logical part of the controller 21, in one embodiment the command state machine and its associated write state machine are physically a part of each of the chips of the array. Essentially, the command state machine reads the condition of all cells of the block and compares the conditions read with the expected condition after an erase. The details of the operations by which this signal and other control signals for operating the flash memory array are generated are described in detail in U.S. patent application Ser. No. 07/655,643, entitled *Command State Machine,* Fandrich et al, filed Feb. 11, 1991, and assigned to the assignee of the present invention, and in U.S. patent application Ser. No. 07/654,375, entitled *Circuitry and Method For Programming and Erasing A Non-volatile Semiconductor Memory,* Kynett et al, filed Feb. 11, 1991, and assigned to the assignee of the present invention. When the erase complete signal is returned by the command state machine indicating that the erase has been completed successfully (and with margin Vme), the process of the present invention causes the rightmost bit of the three bits illustrated in FIG. 6 to be set to a zero. The three status bits remain in this condition until the block is next ready to be erased. When a block of flash memory is targeted for erasure the controller 21 provides another signal, then the middle bit of the block erase status area is set to a zero. When the valid data has all been written to one or more other blocks so that erase may occur, the last of the bits to the left in the figure is programmed to a zero. The process for generating the signals indicating that a block has been targeted for erase and that all the valid data has been written to is described in detail in U.S. patent application Ser. No. 07/969,760, entitled *A Method Of Cleaning Up A Solid State Memory Disk Storing Floating Sector Data,* S. Wells, filed on even date herewith, and assigned to the assignee of the present invention. Then, when the block is erased, all of the transistors in all three of the bit positions of the block erase status area are set to the one condition. Thus, when an erase has been completed, all three bits of the erase status area are changed to ones. Finally, the successful erase signal is returned by the command state machine as explained above, and the rightmost bit is switched to a zero. The erase status process described repeats in a similar manner when the block is again erased after the block fills with new data and a significant portion of that new data becomes invalid.

Power may be removed from the array for various reasons during a period in which a block is being erased. Because the bits of the block erase status area change with the steps of the erase procedure, it is possible to determine at what point during an erase process the power was removed. For example, the flash memory controller only sends the signal indicating that erase has been accomplished after the entire erase process has occurred and the values stored in the block have been read out of the array and compared with the expected condition. Consequently, if this signal has been received, then the erase process has been completed at least as well as the system is capable of completing the process. If power is interrupted at the point at which valid data has been removed from the block and before erase has actually occurred, then all three bits of the block erase status area will be zero. Thus, the review of the block erase status area of a block will indicate whether any individual block has been reliably erased or not. If the block holds the pattern one/one/zero in the block erase status area, then it has been reliably erased. If the block holds the pattern one/zero/zero in the block erase status area, then it has been targeted for erase but erase has not yet started; valid data may have been moved from some sectors of the block to other blocks, but such data will have been marked invalid when that sector has been moved. If, on the other hand, the block holds the pattern one/one/one or zero/zero/zero, then the erase cannot be considered to be reliable since it was interrupted after the erase started but before the erase completed successfully signal was returned; and the erase procedure must be repeated.

Thus, the controller 21 of the flash memory array includes a short program in ROM which is used to interrogate the block erase status area of each of the blocks of the flash memory array whenever the system power is turned on. If the block erase status area of any block is found in the one/one/one or the zero/zero/zero condition, then that block must be erased before it may be used.

In order to increase the assurance that the erase has actually taken place for all of the transistors of each block, when the last bit (leftmost in the FIG. 6) of the erase status bits is programmed to a zero to indicate that erase has begun, the application of the programming voltage is repeated a number of times. This has the effect of forcing that memory transistor to the far right of the rightmost distribution pattern illustrated in FIG. 2. This position is illustrated by an X in FIG. 2.

Consequently, this transistor on the block is among the hardest (if not the hardest) transistor to erase. Consequently, when the block erase status table of that block of the flash memory array is interrogated, the Vt of that transistor will probably be closest to Vcc in the left distribution pattern. Thus, if the scan of the block erase status table shows a zero in the leftmost bit position on the application of power, the erase was marginal; and the block is erased again.

It is conceivable that the transistor which stores the last bit (leftmost in the FIG. 6) which is programmed to a zero a plurality of times to indicate that erase has begun will not fall in the appropriate position in the distribution pattern. However, the system appears to be quite reliable.

As mentioned above, when a block of memory is distributed between a pair of individual chips, the probability of producing an incorrect result in the erase status bits may be reduced by providing a set of erase status bits for each sub-block. This will guard against the occurrence of a condition in which the rightmost bit in the one of the erase status areas is the hardest to switch and is not completely erased when power is removed. Consequently, that erase status area will appear to show that the erase was successfully completed. A second erase status area will make this occurrence much more unlikely. Even more protection may be gained by mirroring the erase status bits in each block status area so that four or even eight sets of erase status areas (each with three bits) exist for each block.

However, to obviate the possibility of the distribution pattern leaving insufficient margin even though the multiply-programmed bit has been switched to a one value, a second method for accomplishing the reliable erasure of a block of flash memory is illustrated in the flow chart of FIG. 8. Rather than using three bits on a block to determine the status of the erase operation, another solution is to store data regarding the erase operation in a sector on another block of the array 20 illustrated in FIG. 4. Whenever an erase is initiated, data is written to a sector indicating that "block 53 has an erase initiated." When the erase process is completed and the signal is returned from the flash memory controller, the sector is invalidated by marking the invalid bit in the header with the logical sector number. Then, whenever power is applied to the system, the sectors of all blocks are scanned for a special sector of this type. If the flash memory controller detects such a sector during power up, the system assumes that the erase operation did not occur and reinitiates the erase of the block. This second method of providing erase reliability assures that the information regarding the initiation and termination of the erase operation is correctly recorded and is not itself distorted by the failure of the erase operation in the block being erased.

Although the present invention has been described in terms of a preferred embodiment, it will be appreciated that various modifications and alterations might be made by those skilled in the art without departing from the spirit and scope of the invention. For example, an especially reliable solution to the problem is to use both types of checks to insure reliability of the erase operation. The invention should therefore be measured in terms of the claims which follow.

What is claimed is:

1. A method for insuring that each erase operation practiced on a block of flash EEPROM transistors which is part of a flash EEPROM memory array is carried out reliably, each flash EEPROM transistor storing a bit having a first state and a second state, each erase operation bringing the bits in the block to the first state, the method comprising the steps of:
   designating a first group of three bits in the block to represent the condition of erase operations;
   b) programming to the second state a first bit of the first group of three bits to indicate that an erase operation should take place on the block;

c) programming to the second state a second bit of the first group of three bits before an erase operation begins;
d) beginning a first erase operation, completion of the first erase operation bringing all bits of the first group of three bits to the first state:
e) if the first erase operation was successfully completed programming to the second state a third bit of the first group of three bits;
f) testing all bits of the first group of three bits to determine their condition in response to the reapplication of power to the flash EEPROM array; and
g) initiating a second erase operation unless the third bit of the first group of three bits is in the second state and the first and the second bit of the three bits both are in the first state.

2. The method of claim 1 in which the step of programming to the second state the second bit of the three bits comprises applying programming signals to the second bit of the first group of three bits a plurality of times such that the second bit of the first group of three bits becomes more difficult to erase.

3. The method of claim 1 wherein step a) includes designating a second group of three bits in the block to represent the condition of erase operations and wherein steps b)–f) are also performed on the second group of three bits.

4. The method of claim 2 wherein step a) includes designating a second group of three bits in the block to represent the condition of erase operations and wherein steps b)–f) are also performed on the second group of three bits.

* * * * *